(12) United States Patent  
Chiou et al.

(10) Patent No.: US 7,923,829 B2
(45) Date of Patent: Apr. 12, 2011

(54) BONDING PAD SHARING METHOD APPLIED TO MULTI-CHIP MODULE AND APPARATUS THEREOF

(75) Inventors: Hsien-Chyi Chiou, Hsinchu (TW); Jui-Ming Wei, Taichung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 336 days.

(21) Appl. No.: 12/115,559

(22) Filed: May 6, 2008

(65) Prior Publication Data

US 2009/0278247 A1   Nov. 12, 2009

(51) Int. Cl.
*H01L 23/02* (2006.01)

(52) U.S. Cl. ........... 257/678; 257/685; 257/686; 326/37

(58) Field of Classification Search .............. 257/678, 257/685, 686, 723–725; 438/6
See application file for complete search history.

(56) References Cited

U.S. PATENT DOCUMENTS

| 6,034,539 | A | 3/2000 | Hwang | |
| 6,724,237 | B2 * | 4/2004 | Yamashita et al. | 327/518 |
| 7,075,175 | B2 * | 7/2006 | Kazi et al. | 257/678 |

\* cited by examiner

*Primary Examiner* — Vibol Tan
(74) *Attorney, Agent, or Firm* — Winston Hsu; Scott Margo

(57) ABSTRACT

A multi-chip module (MCM) includes a first die and a second die. The first die supports a plurality of predetermined functions. The second die is coupled to the first die and comprises at least an option pad configured for a bonding option. The first die performs a predetermined function according to a bonding status of the option pad of the second die.

6 Claims, 2 Drawing Sheets

BONDING PAD SHARING METHOD APPLIED TO MULTI-CHIP MODULE AND APPARATUS THEREOF

BACKGROUND OF THE INVENTION

The present invention relates to a multi-chip module (MCM), and more particularly, to an MCM including one die using an option pad of another die for bonding options and a method thereof.

In integrated circuit (IC) designs, bonding-option technology provides the capability of selectively enabling some of the IC functions to choose a different utilization of the IC. An option pad is generally connected to either a high voltage level (usually the power supply) or a low voltage level (usually the ground) for function selection. For example, the flash die can be set to be in the top mode or the bottom mode for the boot sector according to the voltage level supplied to the option pad of the flash die.

Since the area occupied by an option pad is larger than the area occupied by a chip, how to reduce the number of option pads in order to reduce the size of the package have become important issues in the field.

SUMMARY OF THE INVENTION

According to an exemplary embodiment of the claimed invention, a multi-chip module (MCM) is disclosed. The MCM comprises a first die, which supports a plurality of predetermined functions; and a second die, which is coupled to the first die and comprises at least an option pad configured for a bonding option. In addition, the first die performs a predetermined function according to a bonding status of the option pad of the second die.

According to an exemplary embodiment of the claimed invention, a bonding pad sharing method applied to a multi-chip module (MCM) is disclosed. The method comprises: configuring the MCM to have a first die and a second die, wherein the first die supports a plurality of predetermined functions, and the second die is coupled to the first die and comprises at least an option pad configured for a bonding option; and configuring the first die to perform a predetermined function according to a bonding status of the option pad of the second die.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
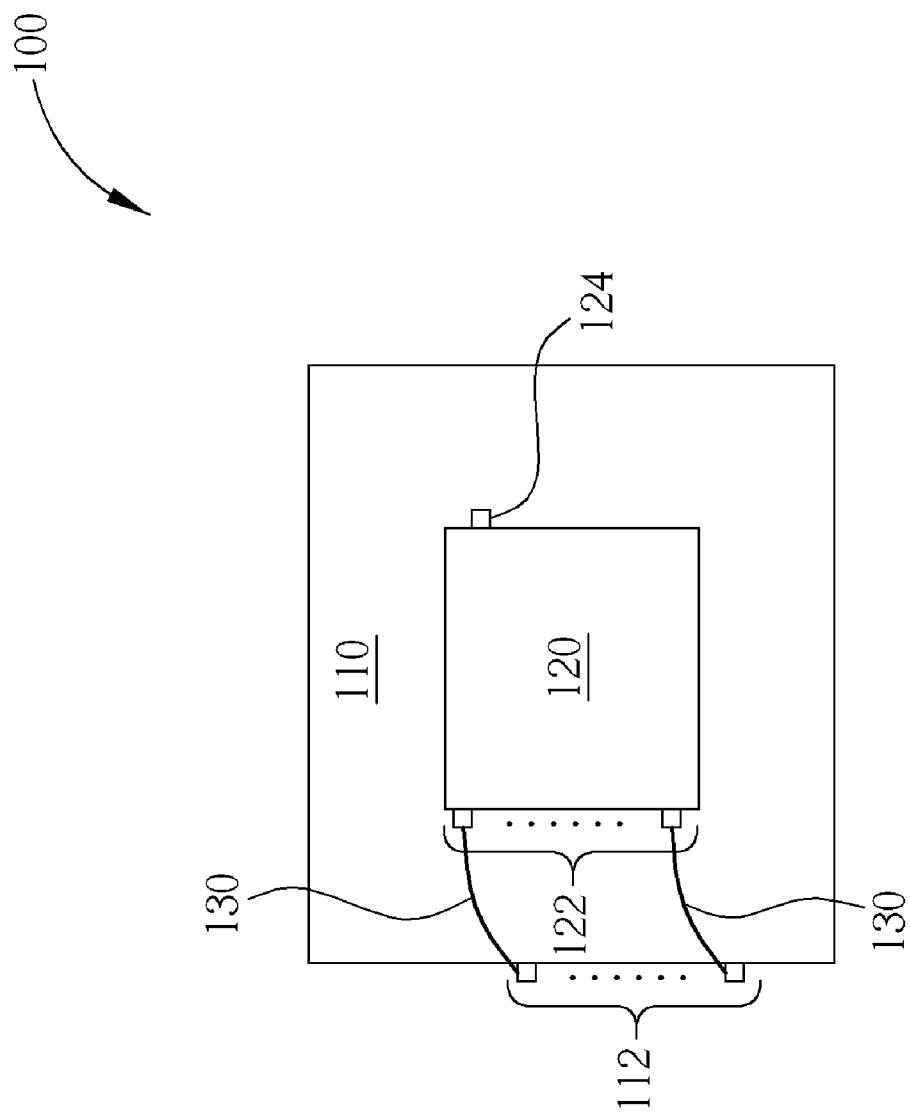
FIG. 1 is a schematic diagram illustrating a multi-chip module (MCM) according to an embodiment of the present invention.

Please refer to FIG. 1. FIG. 1 is a schematic diagram illustrating a multi-chip module (MCM) 100 according to an embodiment of the present invention. As shown in FIG. 1, the MCM 100 comprises a first die 110 and a second die 120. The first die 110 and the second die 120 respectively comprise a plurality of signal pads 112 and a plurality of signal pads 122 for signal passing. A plurality of wires 130 connect the signal pads 112 of the first die 110 to the signal pads 122 of the second die 120 to allow the first die 110 to be able to communicate with the second die 120. Further description of the MCM 100 is detailed as follows.

Figure 2:
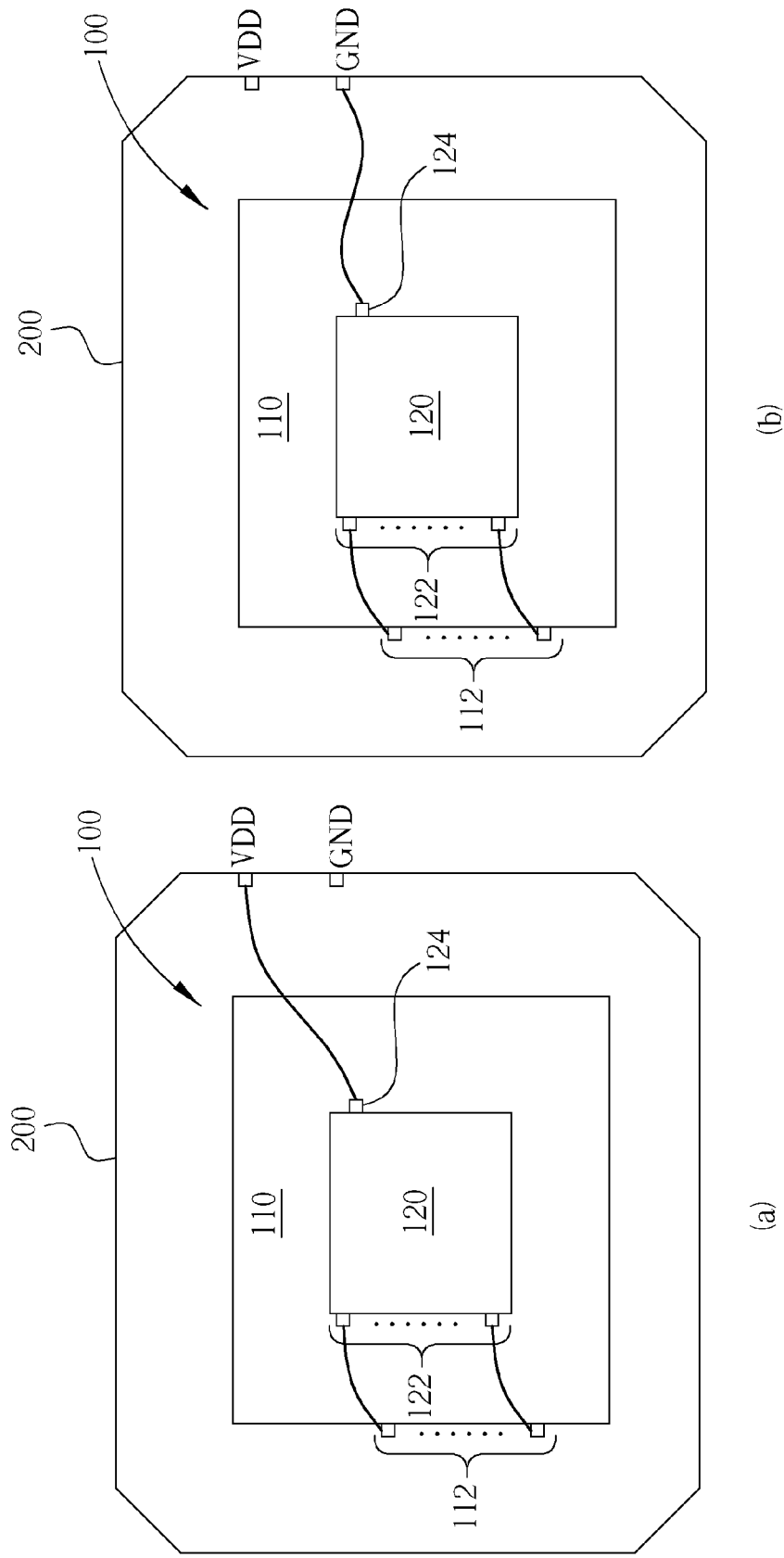
FIG. 2 is a schematic diagram illustrating the MCM shown in FIG. 1 packed in a package.

In this embodiment, the first die 110 is a core die and comprises a processor core (not shown in FIG. 1) such as an advanced RISC machine (ARM), a digital signal processor (DSP), a microprocessor and so on. The second die 120 is a memory die such as a flash die, a DRAM die and so forth. The second die 120 comprises an option pad 124. A bonding status of the option pad 124 determines which mode the second die is in. Please refer to FIG. 2. FIG. 2 is a schematic diagram illustrating the MCM 100 shown in FIG. 1 packed in a package 200. For example, the second die 120 is a flash die. If the option pad 124 of the second die 120 is connected to a power supply VDD as shown in a sub-diagram (a) of FIG. 2, the second die 120 is set to be in a top mode. On the other hand, if the option pad 124 of the second die 120 is connected to a ground GND as shown in a sub-diagram (b) of FIG. 2, the second die 120 is set to be in a bottom mode.

Moreover, not only the mode of the second die 120 is determined in accordance with the bonding status (e.g., the voltage level) of the option pad 124, but also a device identification (ID) is determined based on the bonding status of the option pad 124. Thus, the first die 110 can utilize its processor core to access the device ID of the second die 120 to know the bonding status of the option pad 124 of the second die 120, and is able to perform a predetermined function according to the bonding status of the option pad 124 of the second die 120. For example, the first die 110 supports two predetermined functions FUN1 and FUN2. If the first die 110 identifies the option pad 124 is connected to the power supply VDD as shown in a sub-diagram (a) of FIG. 2 by means of accessing the device ID of the second die 120, the first die 110 performs the predetermined function FUN1. If the first die 110 identifies the option pad 124 of the second die 120 is connected to the ground GND as shown in a sub-diagram (b) of FIG. 2 by means of accessing the device ID of the second die 120, the first die 110 performs the predetermined function FUN2.

Please note that in the above embodiment the first die 110 has no option pad; however, this is not a limitation of the prevent invention. In other embodiments, the first die 110 can comprise the option pad(s) but the option pads are not enough. In addition, the first die 110 and the second die 120 is a core die and a memory die respectively in the above embodiment; this is also not a limitation of the prevent invention. As long as the first die is able to perform a predetermined function according to the bonding status of the option pad of the second die, the MCM obeys the spirit of the present invention.

In the MCM of the present invention, since one die (e.g., the first die) is able to use an option pad of another die (e.g., the second die), the number of option pads in the MCM can be reduced or even equal to zero. Thus, the MCM can have more signal pads for use, or the size of the first die can be reduced.

Those skilled in the art will readily observe that numerous modifications and alterations of the device and method may be made while retaining the teachings of the invention.

What is claimed is:

1. A multi-chip module (MCM), comprising:
    a first die, supporting a plurality of predetermined functions; and
    a second die, coupled to the first die, comprising at least an option pad configured for a bonding option;
    wherein the first die performs a predetermined function according to a bonding status of the option pad of the second die, the second die is a memory die having a device identification based on the bonding status of the option pad, and the first die accesses the device identification to perform the predetermined function corresponding to the device identification.

2. The MCM of claim 1, wherein the first die comprises no option pad configured for a bonding option.

3. The MCM of claim 1, wherein the first die comprises a processor core.

4. A boding pad sharing method applied to a multi-chip module (MCM), comprising:
    configuring the MCM to have a first die and a second die, wherein the first die supports a plurality of predetermined functions, and the second die is coupled to the first die and comprises at least an option pad configured for a bonding option;
    configuring the first die to perform a predetermined function according to a bonding status of the option pad of the second die;
    implementing the second die utilizing a memory die having a device identification based on the bonding status of the option pad; and
    utilizing the first die to access the device identification and then perform the redetermined function corresponding to the device identification.

5. The boding pad sharing method of claim 4, wherein the step of configuring the MCM to have the first die and the second die comprises:
    implementing the first die comprising no option pad configured for a bonding option in the MCM.

6. The boding pad sharing method of claim 4, wherein the step of configuring the MCM to have the first die and the second die comprises:
    implementing the first die comprising a processor core in the MCM.

* * * * *